United States Patent
Tang (10) Patent No.: US 12,381,555 B2
(45) Date of Patent: Aug. 5, 2025

(54) PUSH-PULL BUFFER CIRCUIT

(71) Applicant: TEXAS INSTRUMENTS INCORPORATED, Dallas, TX (US)

(72) Inventor: Nghia Tang, Flower Mound, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 18/731,518

(22) Filed: Jun. 3, 2024

(65) Prior Publication Data

US 2024/0322825 A1    Sep. 26, 2024

Related U.S. Application Data

(63) Continuation of application No. 17/823,721, filed on Aug. 31, 2022, now Pat. No. 12,028,065.

(51) Int. Cl.
| | | |
|---|---|---|
| H03K 19/00 | (2006.01) | |
| H03F 3/26 | (2006.01) | |
| H03F 3/45 | (2006.01) | |

(52) U.S. Cl.
CPC ......... *H03K 19/0013* (2013.01); *H03F 3/265* (2013.01); *H03F 3/45183* (2013.01)

(58) Field of Classification Search
CPC . G05F 1/575; G05F 3/262; G05F 1/56; G05F 1/46; G05F 1/59; G05F 3/26; H03F 3/45183; H03F 3/505; H03F 2203/45674; H03F 3/45475; H03F 1/32; H03F 2203/5018; H03F 2203/5021; H03F 3/04; H03F 3/265; H03F 3/3028; H03F 3/45201; H03F 19/0013; H03K 19/00315; H03K 19/018507; H03K 19/018514
See application file for complete search history.

(56) References Cited

U.S. PATENT DOCUMENTS

| | | | |
|---|---|---|---|
| 5,818,295 A * | 10/1998 | Chimura | H03F 3/45183 330/253 |
| 6,285,256 B1 | 9/2001 | Wong | |
| 8,917,077 B2 | 12/2014 | Lin | |
| 10,317,925 B2 | 6/2019 | Agarwal | |
| 10,425,101 B1 * | 9/2019 | Tao | H03F 3/45475 |
| 2015/0229273 A1 | 8/2015 | Liu | |
| 2021/0194346 A1 * | 6/2021 | Phogat | G05F 1/575 |
| 2022/0077831 A1 * | 3/2022 | Pignolo | H03F 3/45269 |

* cited by examiner

*Primary Examiner* — Lincoln D Donovan
*Assistant Examiner* — Tyler J Pereny
(74) *Attorney, Agent, or Firm* — Valerie M. Davis; Frank D. Cimino (57) ABSTRACT

A circuit includes a first transistor having a first current terminal, a second current terminal, and a control terminal, the first current terminal coupled to an output terminal, and the control terminal coupled to an input terminal, a second transistor having a first current terminal, a second current terminal, and a control terminal, the first current terminal coupled to the second current terminal of the first transistor, a third transistor having a first current terminal, a second current terminal, and a control terminal, the first current terminal coupled to the output terminal, and the control terminal coupled to the second current terminal of the second transistor, and a fourth transistor having a first current terminal and a control terminal, the first current terminal coupled to the second current terminal of the second transistor, and the control terminal coupled to the second current terminal of the third transistor.

20 Claims, 5 Drawing Sheets

PUSH-PULL BUFFER CIRCUIT

RELATED APPLICATIONS

This application is a continuation of U.S. patent application Ser. No. 17/823,721, filed Aug. 31, 2022, which Application is hereby incorporated herein by reference in its entirety.

BACKGROUND

A buffer circuit, or buffer, is an electrical circuit that is intended to prevent one circuit from electrically loading another circuit while passing a signal between the circuits. For example, an output buffer may be used to communicate a signal from a circuit to a load that has a low impedance while preventing the circuit from experiencing the large current fluctuations that are associated with driving a low impedance load. A buffer circuit may be used as the output stage of an amplifier to isolate a preamplifier stage from the load driven by the amplifier.

SUMMARY

In one example, a circuit includes a first transistor having a first current terminal, a second current terminal, and a control terminal, the first current terminal coupled to an output terminal, and the control terminal coupled to an input terminal and a second transistor having a first current terminal, a second current terminal, and a control terminal, the first current terminal coupled to the second current terminal of the first transistor. The circuit also includes a third transistor having a first current terminal, a second current terminal, and a control terminal, the first current terminal coupled to the output terminal, and the control terminal coupled to the second current terminal of the second transistor and a fourth transistor having a first current terminal, a second current terminal, and a control terminal, the first current terminal coupled to the second current terminal of the second transistor, and the control terminal coupled to the second current terminal of the third transistor.

In another example, a system includes a controller adapted to be coupled to a connector, the controller configured to provide power to the connector. the controller includes an amplifier configured to send a fixed frequency signal to the connector. The amplifier includes a buffer circuit. The buffer circuit includes a first transistor having a first current terminal, a second current terminal, and a control terminal, the first current terminal coupled to an output terminal, and the control terminal coupled to an input terminal and a second transistor having a first current terminal, a second current terminal, and a control terminal, the first current terminal coupled to the second current terminal of the first transistor. The buffer circuit also includes a third transistor having a first current terminal, a second current terminal, and a control terminal, the first current terminal coupled to the output terminal, the second current terminal coupled to a ground terminal, and the control terminal coupled to the second current terminal of the second transistor and a fourth transistor having a first current terminal, a second current terminal, and a control terminal, the first current terminal coupled to the second current terminal of the second transistor, the second current terminal coupled to the ground terminal, and the control terminal coupled to the second current terminal of the third transistor.

In a further example, a circuit includes a preamplifier circuit having an input and an output and a buffer circuit. The buffer circuit includes a first transistor having a first current terminal, a second current terminal, and a control terminal, the first current terminal coupled to the input of the preamplifier circuit and the control terminal coupled to the output of the preamplifier circuit and a second transistor having a first current terminal, a second terminal, and a control terminal, the first current terminal coupled to the second current terminal of the first transistor. The buffer circuit also includes a third transistor having a first current terminal, a second current terminal, and a control terminal, the first current terminal coupled to the input of the preamplifier circuit, and the control terminal coupled to the second current terminal of the second transistor and a fourth transistor having a first current terminal, a second current terminal, and a control terminal, the first current terminal coupled to the second current terminal of the second transistor, and the control terminal coupled to the second current terminal of the second transistor.

DETAILED DESCRIPTION

Amplifiers are used in a wide variety of applications. In one application, an amplifier is included in a load-measuring system that measures parameters (e.g., resistance and capacitance) of a load by driving a fixed frequency signal to the load, and estimating the load parameters based on the measured magnitude change and phase shift of the signal. An amplifier provided in such a system may be configured with feedback and dominant pole compensation for stability. If the load to be measured varies over several orders of magnitude, the load pole (or output pole) can move across a wide range of frequency and cause instability. Additionally, to provide high accuracy, a large output range is desirable to maximize the signal amplitude and the signal-to-noise ratio. The amplifier should preferably have strong sinking and sourcing capabilities to drive a heavy load with low resistance and high capacitance.

Some amplifiers include a common-drain push-pull buffer circuit that includes a high-side n-channel field effect transistor (NFET) and a low-side p-channel field effect transistor (PFET). The output range of such buffer circuits is limited to the power supply voltage less the gate-source voltages of the transistors. One of the transistors can be replaced by a resistor or a current source to improve the output range, but with increased current consumption. For example, if the load ranges from +IMAX to −IMAX, the current consumption is at least 2*IMAX when the load is +IMAX. If the buffer needs to provide an output voltage that is near ground while sinking IMAX, the pull-down resistor needs to be very small, or the current source needs to be very strong. In such buffer circuits, the overall current consumption can be several times higher than IMAX.

The push-pull buffer circuits described herein provide a low output impedance and a large output signal range. The buffer circuits include a common-drain circuit to provide low impedance, and a common source circuit to pull the output signal to the power supply voltage or reference voltage (ground) for large output swing. Current sink and source devices are dynamically controlled to modulate output current. A current feedback loop steers supply current between the sink and source devices to provide efficient sinking and sourcing of load current.

Figure 1:
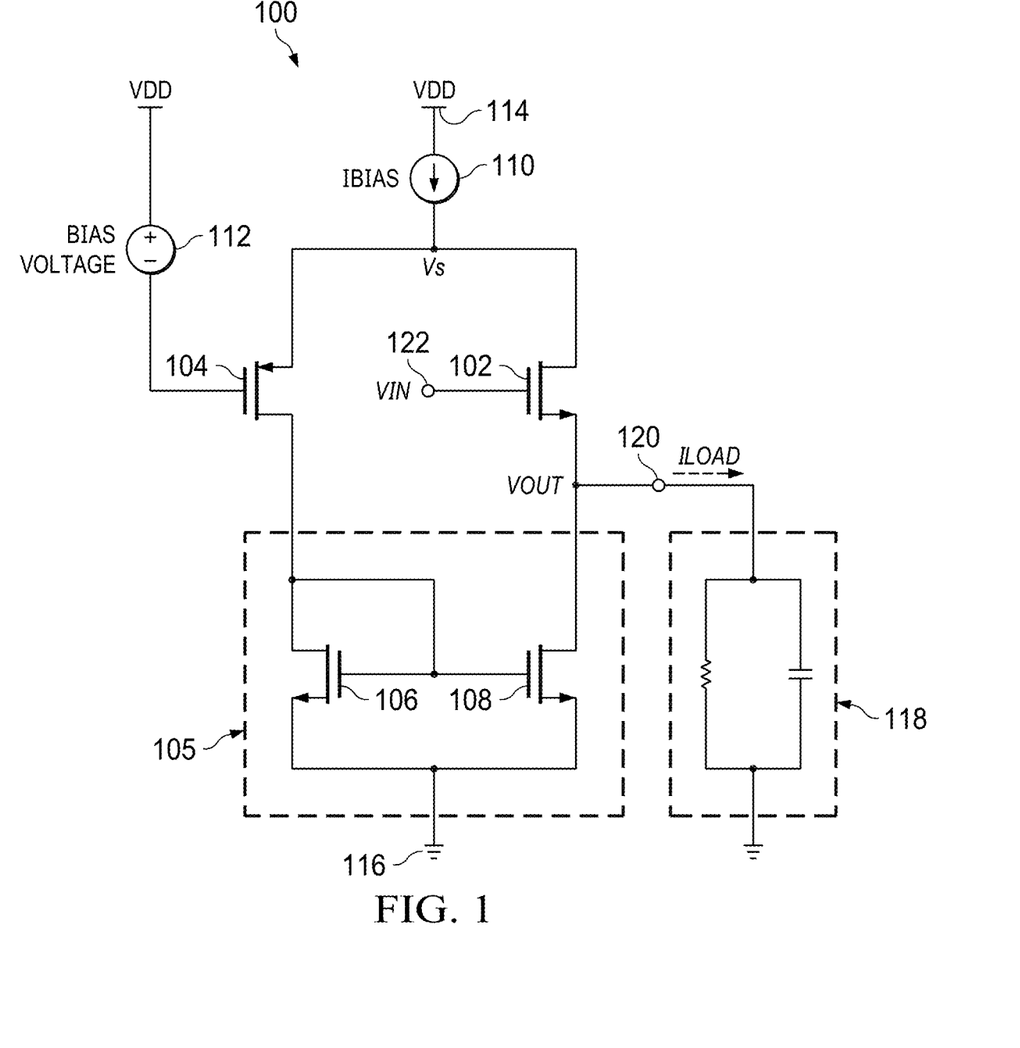
FIG. 1 is a schematic level diagram of an example push-pull buffer circuit that steers power supply current between source and sink transistors to efficiently drive a load.

FIG. 1 is a schematic level diagram of an example push-pull buffer circuit 100 that steers power supply current between source and sink transistors to efficiently drive a load. The push-pull buffer circuit 100 includes a transistor 102, a transistor 104, a current mirror circuit 105, a constant current source 110, and a bias voltage circuit 112. The current mirror circuit 105 includes a transistor 106 and a transistor 108. The transistor 102, the transistor 106, and the transistor 108 may be NFETs. The transistor 104 may be a PFET. Output of the push-pull buffer circuit 100 is provided at a load terminal 120 to drive a load 118. The push-pull buffer circuit 100 receives input signal at a preamplifier terminal 122.

The constant current source 110 includes an input coupled to a power supply terminal 114, and an output coupled to a first current terminal (e.g., drain) of the transistor 102 and a first current terminal (e.g., source) of the transistor 104. A second current terminal (e.g., source) of the transistor 102 is coupled to the load terminal 120 for sourcing current to the load terminal 120 (and the load 118). A control terminal of the transistor 102 is coupled to the preamplifier terminal 122 for receipt of input signal. The constant current source 110 provides a constant bias current (IBIAS) to the transistor 102 and the transistor 104.

The bias voltage circuit 112 generates a voltage for biasing the transistor 104. The bias voltage circuit 112 includes an input coupled to the power supply terminal 114, and an output coupled to a control terminal (e.g., gate) of the transistor 104. A second current terminal (e.g., drain) of the transistor 104 is coupled to the current mirror circuit 105. The transistor 106 is diode-connected, and includes a first current terminal (e.g., drain) coupled to the second current terminal of the transistor 104 and a control terminal (e.g., gate) of the transistor 106. A second current terminal (e.g., source) of the transistor 106 is coupled to a ground terminal 116. The transistor 108 includes a control terminal (e.g., gate) coupled to the control terminal of the transistor 106, and a first current terminal (e.g., source) coupled to the ground terminal 116. A second current terminal (e.g., drain) of the transistor 108 is coupled to the load terminal 120 for sinking current from the load terminal 120 (and the load 118).

The transistor 102 and the transistor 104 share IBIAS. When load current (the current ILOAD drawn at the load terminal 120 by the load 118) increases, a greater portion of IBIAS flows through the transistor 102, and a smaller portion of IBIAS flows through the transistor 104. Accordingly, IBIAS is the maximum current that can be sourced by the push-pull buffer circuit 100. When sourcing maximum current, all of IBIAS flows through the transistor 102, and none of IBIAS flows through the transistor 104. When load current decreases, a greater portion of IBIAS flows through the transistor 104, and a smaller portion of IBIAS flows through the transistor 102. Current flowing through the transistor 104 flows through the transistor 106, and is mirrored by a current flowing through the transistor 108 from the load terminal 120. Accordingly, the transistor 108 sinks the load current. If the transistor 106 and the transistor 108 are the same size (have the same channel width), then the largest load current that the transistor 108 can sink is equal to IBIAS. When the transistor 108 is sinking a load current equal to IBIAS, all of IBIAS flows through the transistor 104, and none of IBIAS flows through the transistor 102.

Some implementations of the current mirror circuit 105 allow the push-pull buffer circuit 100 to sink a load current that is greater than IBIAS. In such implementations of the current mirror circuit 105, the transistor 108 is larger than the transistor 106 (e.g., the channel width of the transistor 108 is N times that of the transistor 106 creating a 1:N ratio). For example, if the current mirror circuit 105 has a 1:2 ratio, then the transistor 108 can sink a load current that is equal to 2*IBIAS. Such implementations allow the voltage at the load terminal 120 (VOUT) to be pulled near ground where the transistor 108 falls into the triode region. The larger the current gain of the current mirror circuit 105, the closer to ground the transistor 108 can pull VOUT while sinking a load current equal to IBIAS.

The output impedance of the push-pull buffer circuit 100 is approximately 1/gm, where gm is the transconductance of the transistor 102. The transistor 104 causes the internal node Vs to operate as an AC ground, and therefore the transistor 102 behaves as connected in a common-drain circuit. The transistor 102, the transistor 104, the transistor 106, and the transistor 108 form a current feedback loop. The loop acts to distribute IBIAS between the transistor 102 and transistor 104 such that:

$$ILOAD = I_{DM1} + I_{DM4}$$

where:
$I_{DM1}$ is the current flowing through the transistor 102; and
$I_{DM4}$ is the current flowing through the transistor 108.

The loop gain is equal to the gain of the current mirror circuit 105. With a gain of one, the loop is inherently stable. The current mirror circuit 105 may have a larger gain to increase the sinking capability, but it may degrade the loop stability. Good stability can be easily achieved with a loop gain less than 10 (or 20 dB). All internal nodes of the push-pull buffer circuit 100 have low impedance. Therefore, all poles are at high frequency, and the loop can be made high speed. This characteristic makes the push-pull buffer circuit 100 easy to integrate in a larger control loop.

Figure 2:
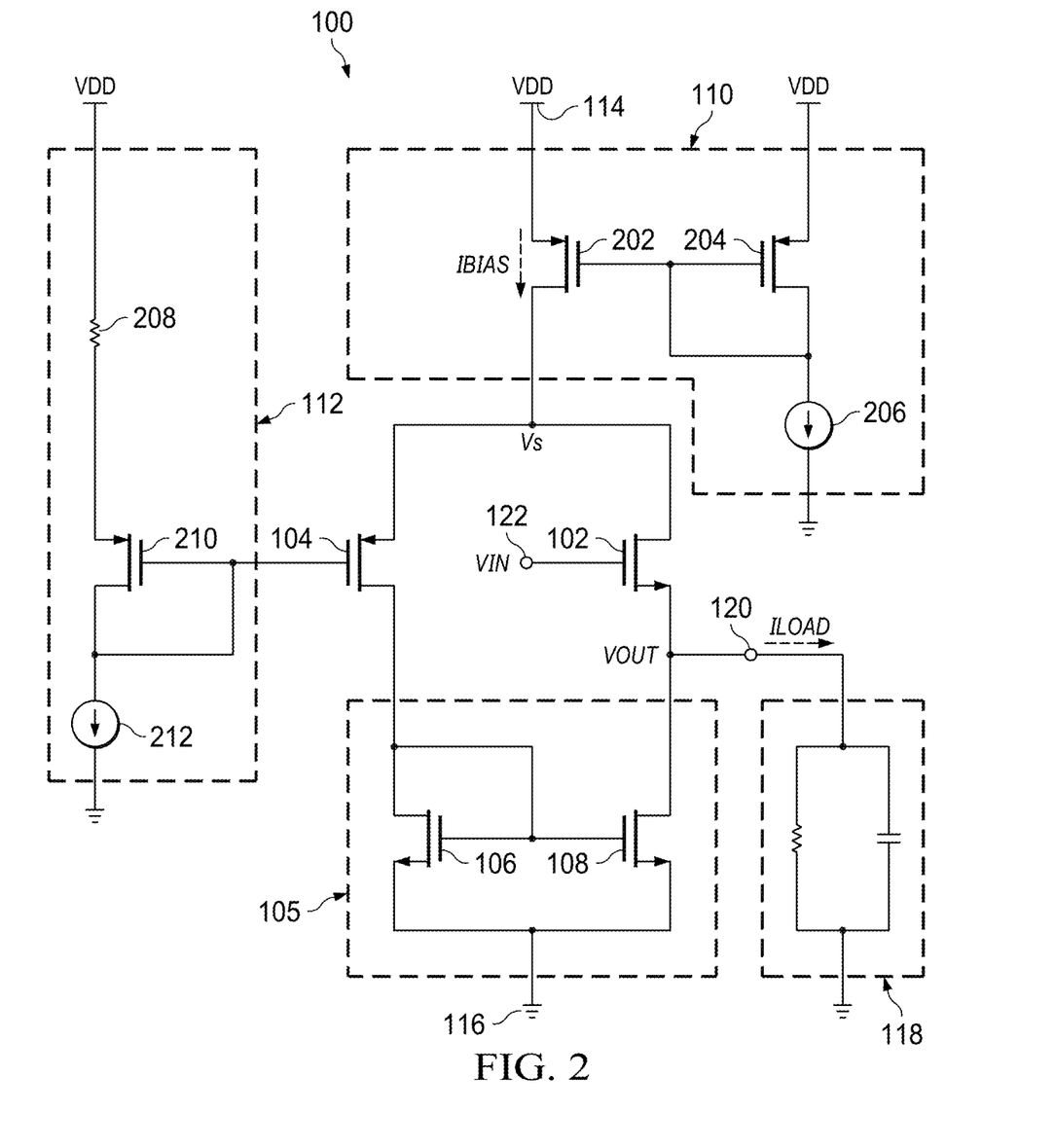
FIG. 2 is a schematic level diagram of the push-pull buffer circuit of FIG. 1 with example bias circuits.

FIG. 2 is a schematic level diagram of the push-pull buffer circuit 100 with example bias circuits. The constant current source 110 includes a transistor 202 and a transistor 204 arranged as a current mirror, and a current source 206. The transistor 202 and the transistor 204 may be PFETs. A first current terminal (e.g., source) of the transistor 202 is coupled to the power supply terminal 114. A second current terminal (e.g., drain) of the transistor 202 is coupled to the first current terminal of the transistor 102 and the first current terminal of the transistor 104. A first current terminal (e.g., source) of the transistor 204 is coupled to the power supply terminal 114. A second current terminal (e.g., drain) of the transistor 204 is coupled to a control terminal (e.g., gate) of the transistor 204 and to a control terminal (e.g., gate) of the transistor 202. An input of the current source 206 is coupled to the second current terminal of the transistor 204, and an output of the current source 206 is coupled to the ground terminal 116. IBIAS flows through the transistor 202. IBIAS is defined by the current source 206 and the ratio of the current mirror formed by the transistor 202 and the transistor 204.

The bias voltage circuit 112 includes a resistor 208, a transistor 210, and a current source 212. The transistor 210 is diode-connected. The resistor 208 is coupled between the power supply terminal 114 and a first current terminal (e.g., source) of the transistor 210. A second current terminal of the transistor 210 is coupled to a control terminal (e.g., gate) of the transistor 210 and the control terminal of the transistor 104. The current source 212 includes an input coupled to the second current terminal of the transistor 210, and an output coupled to the ground terminal 116. The transistor 210 and the resistor 208 are selected to ensure that the transistor 202 is in saturation when all of IBIAS flows through the transistor 104.

Figure 3:
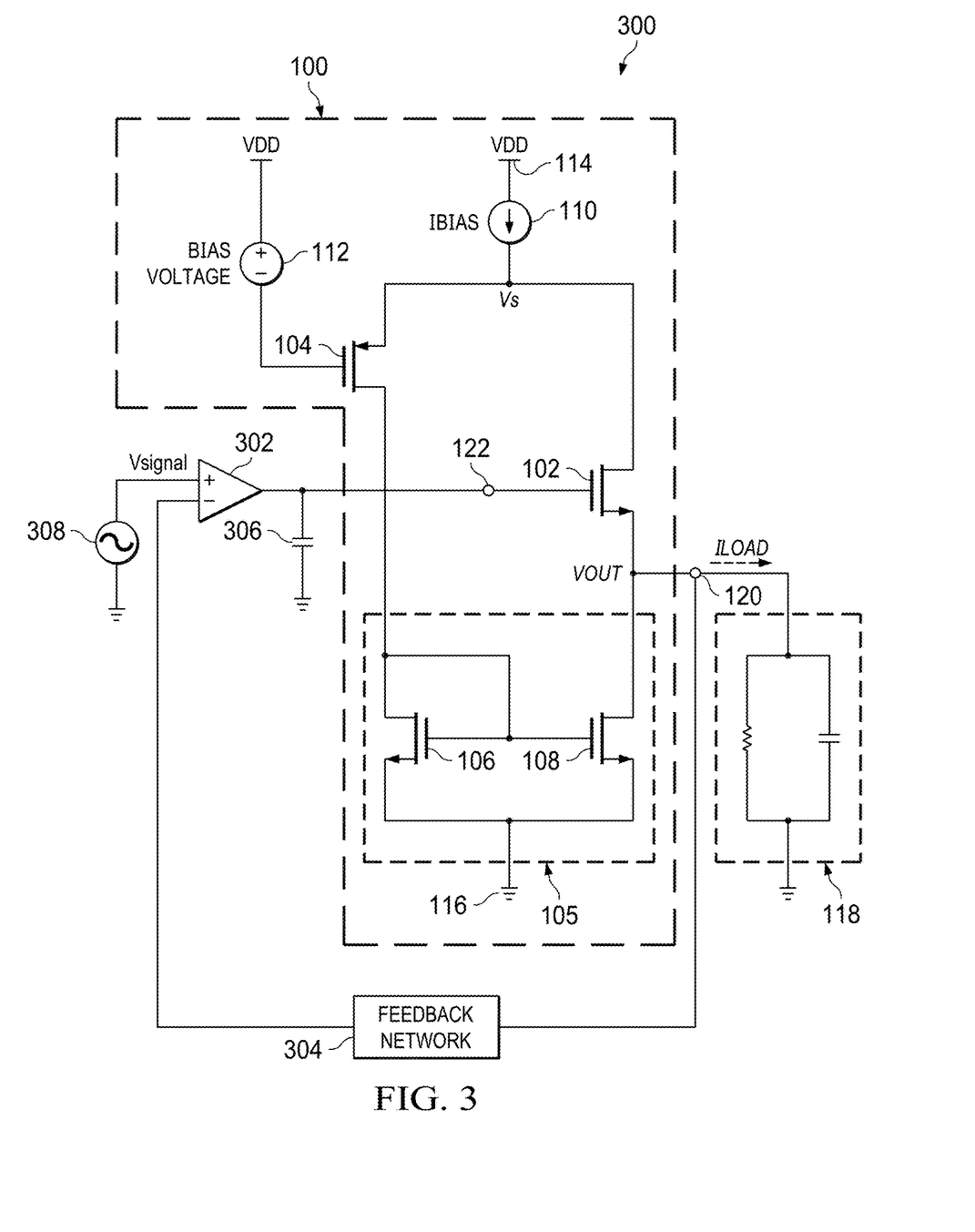
FIG. 3 is a block diagram of an example amplifier circuit that includes the push-pull buffer circuit of FIG. 1.

FIG. 3 is a block diagram of an example amplifier circuit 300 that includes the push-pull buffer circuit 100. The amplifier circuit 300 includes a preamplifier circuit 302, a feedback network 304, and a compensation capacitor 306 coupled to the push-pull buffer circuit 100. The preamplifier circuit 302 includes a signal input (e.g., non-inverting input) coupled to a signal source 308. The preamplifier circuit 302 includes a feedback input (e.g., inverting input) coupled to the load terminal 120 of the push-pull buffer circuit 100 via the feedback network 304. The feedback network 304 may include one or more components (e.g., resistors and/or capacitors) selected and arranged to condition feedback to the preamplifier circuit 302. An output (preamp output) of the preamplifier circuit 302 is coupled to the preamplifier terminal 122 of the push-pull buffer circuit 100. The compensation capacitor 306 is coupled between the output of the preamplifier circuit 302 and the ground terminal 116.

The current loop of the push-pull buffer circuit 100 controls the output current, and the outer loop formed by the preamplifier circuit 302 and the feedback network 304 controls the output voltage. Because the push-pull buffer circuit 100 has low output impedance, the voltage loop can be designed with a dominant internal pole placing the compensation capacitor 306 on-chip. The amplifier circuit 300 is stable across a wide range of load without using external components or a dummy load. Because the current loop of the push-pull buffer circuit 100 is fast, the current loop does not substantially limit the bandwidth of the voltage loop when stability is considered.

Figure 4:
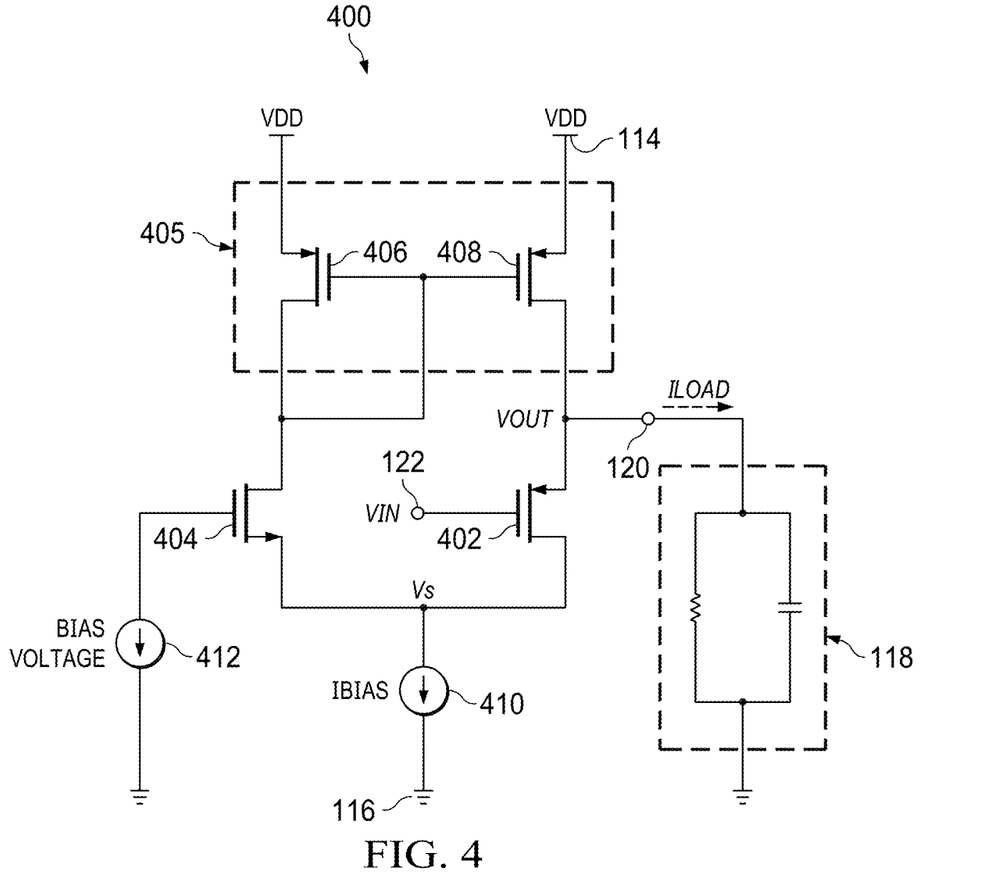
FIG. 4 is a schematic level diagram of another example push-pull buffer circuit that steers power supply current between source and sink transistors to efficiently drive a load.

FIG. 4 is a schematic level diagram of another example push-pull buffer circuit 400 that steers power supply current between source and sink transistors to efficiently drive a load. The operating principle of the push-pull buffer circuit 400 is the same as that of the push-pull buffer circuit 100, but the push-pull buffer circuit 400 is configured to allow the output voltage to be driven near the power supply voltage (VDD). The push-pull buffer circuit 400 includes a transistor 402, a transistor 404, a current mirror circuit 405, a constant current source 410, and a bias voltage circuit 412. The current mirror circuit 405 includes a transistor 406 and a transistor 408. The transistor 402, the transistor 406, and the transistor 408 may be PFETs. The transistor 404 may be an NFET. Output of the push-pull buffer circuit 400 is provided at the load terminal 120 to drive the load 118. The push-pull buffer circuit 400 receives input signal at the preamplifier terminal 122.

The constant current source 410 includes an output coupled to the ground terminal 116, and an input coupled to a first current terminal (e.g., drain) of the transistor 402 and a first current terminal (e.g., source) of the transistor 404. A second current terminal (e.g., source) of the transistor 402 is coupled to the load terminal 120 for sinking current from the load terminal 120 (and the load 118). A control terminal of the transistor 402 is coupled to the preamplifier terminal 122 for receipt of input signal. The constant current source 410 draws a constant bias current (IBIAS) from the transistor 402 and the transistor 404.

The bias voltage circuit 412 generates a voltage for biasing the transistor 404. The bias voltage circuit 412 is coupled between the ground terminal 116 and the control terminal (e.g., gate) of the transistor 404. A second current terminal (e.g., drain) of the transistor 404 is coupled to the current mirror circuit 405. The transistor 406 is diode-connected, and includes a first current terminal (e.g., drain) coupled to the second current terminal of the transistor 404 and a control terminal (e.g., gate) of the transistor 406. A second current terminal (e.g., source) of the transistor 406 is coupled to the power supply terminal 114. The transistor 408 includes a control terminal (e.g., gate) coupled to the control terminal of the transistor 406, and a first current terminal (e.g., source) coupled to the power supply terminal 114. A second current terminal (e.g., drain) of the transistor 408 is coupled to the load terminal 120 for sourcing current to the load terminal 120 (and the load 118).

The transistor 402 and the transistor 404 share IBIAS. When load current decreases, a greater portion of IBIAS flows through the transistor 402, and a smaller portion of IBIAS flows through the transistor 404. Accordingly, IBIAS is the maximum current that can be sunk by the push-pull buffer circuit 100. When sinking maximum current, all of IBIAS flows through the transistor 402, and none of IBIAS flows through the transistor 404. When load current increases, a greater portion of IBIAS flows through the transistor 404, and a smaller portion of IBIAS flows through the transistor 402. Current flowing through the transistor 404 flows through the transistor 406, and is mirrored by a current flowing through the transistor 408 to the load terminal 120. Accordingly, the transistor 408 sources the load current. If the transistor 406 and the transistor 408 are the same size (the same channel widths), then the largest load current that the transistor 408 can source is equal to IBIAS. When the transistor 408 is sourcing a load current equal to IBIAS, all of IBIAS flows through the transistor 404, and none of IBIAS flows through the transistor 402.

Some implementations of the current mirror circuit 405 allow the push-pull buffer circuit 400 to source a load current that is greater than IBIAS. In such implementations of the current mirror circuit 405, the transistor 408 is larger than the transistor 406 (e.g., the channel width of the transistor 408 is N times that of the transistor 406 creating a 1:N ratio). For example, if the current mirror circuit 405 has a 1:2 ratio, then the transistor 408 can source a load current that is equal to IBIAS*2. Such implementations allow the voltage at the load terminal 120 (VOUT) to be pulled near VDD. The larger the current gain of the current mirror circuit 405, the closer to VDD the transistor 408 can pull VOUT while sourcing a load current equal to IBIAS.

Figure 5:
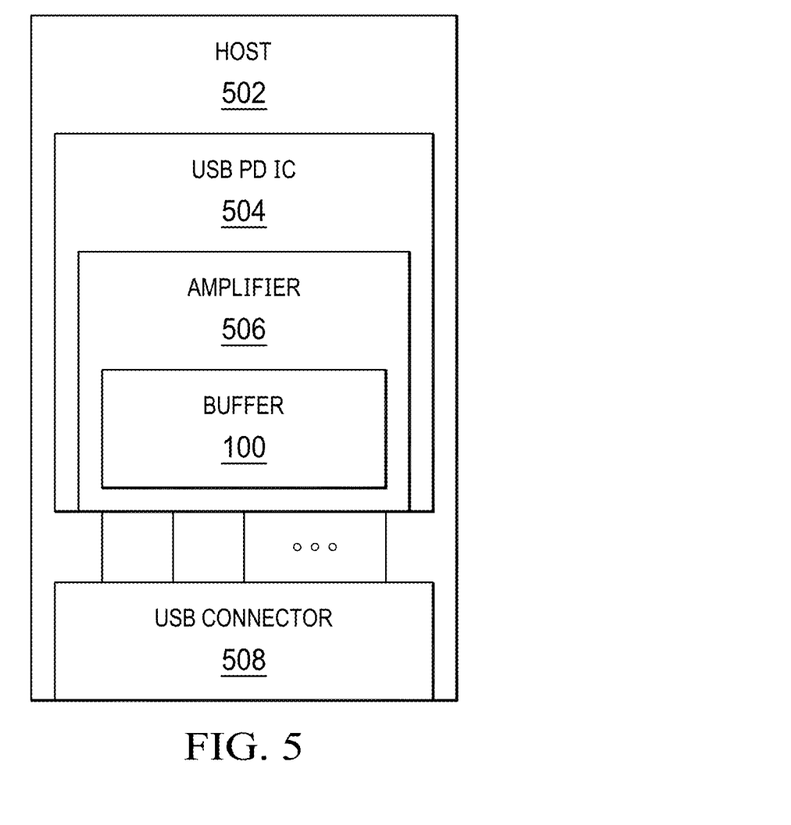
FIG. 5 is a block diagram of an example serial bus host device that includes the push-pull buffer circuit of FIG. 1.

FIG. 5 is a block diagram of an example serial bus host device 502 that includes the push-pull buffer circuit 100. The serial bus host device 502 is shown as being configured to interface with a serial bus compliant with universal serial bus (USB) standard. The serial bus host device 502 includes a USB power delivery controller 504. The USB power delivery controller 504 is coupled to a USB connector 508. The serial bus host device 502 switches power to USB devices coupled to the USB connector 508. The USB power delivery controller 504 includes an amplifier 506. The amplifier 506 includes an example of the push-pull buffer circuit 100 or the push-pull buffer circuit 400. The amplifier 506 may send a fixed frequency signal to a USB device connected to the USB connector 508 to estimate the resistance and capacitance of the load presented by the USB device. The push-pull buffer circuit 100 provides the amplifier 506 with a large output range, and strong sinking and sourcing capabilities to drive a heavy load with low resistance and high capacitance.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A circuit, comprising:
   a first transistor having a first current terminal, a second current terminal, and a control terminal, the first current terminal directly connected to an output terminal, and the control terminal directly connected to an input terminal;
   a second transistor having a first current terminal, a second current terminal, and a control terminal, the first current terminal coupled to the second current terminal of the first transistor, the control terminal coupled to a bias voltage terminal, and the first and second transistors are opposite transistor types;
   a third transistor having a first current terminal, a second current terminal, and a control terminal, the first current terminal coupled to the output terminal, and the control terminal coupled to the second current terminal of the second transistor; and a fourth transistor having a first current terminal, a second current terminal, and a control terminal, the first current terminal coupled to the second current terminal of the second transistor, and the control terminal coupled to the second current terminal of the third transistor.

2. The circuit of claim 1, further comprising a current source coupled to the second current terminal of the first transistor and the first current terminal of the second transistor.

3. The circuit of claim 2, wherein the current source comprises:
  a fifth transistor including:
    a first current terminal coupled to a power supply terminal;
    a second current terminal coupled to a current source; and
    a control terminal coupled to the second current terminal of the fourth transistor; and
  a sixth transistor including:
    a first current terminal coupled to the power supply terminal;
    a second current terminal coupled to the second current terminal of the first transistor; and
    a control terminal coupled to the control terminal of the fifth transistor.

4. The circuit of claim 1, further comprising a bias voltage circuit coupled to the bias voltage terminal.

5. The circuit of claim 4, wherein the bias voltage circuit comprises:
  a fifth transistor including:
    a first current terminal;
    a second current terminal coupled to a current source; and
    a control terminal coupled to the current source and the control terminal of the second transistor; and
  a resistor coupled between a power supply terminal and the first current terminal of the fifth transistor.

6. The circuit of claim 1, wherein the first transistor is an n-type transistor and the second transistor is a p-type transistor.

7. The circuit of claim 6, wherein the third transistor is an n-type transistor and the fourth transistor is an n-type transistor.

8. The circuit of claim 7, wherein the first transistor is an n-channel field effect transistor (NFET), the second transistor is a p-channel filed effect transistor (PFET), the third transistor is an NFET, and the fourth transistor is an NFET.

9. The circuit of claim 1, wherein the first transistor is a PFET, the second transistor is an NFET, the third transistor is a PFET, and the fourth transistor is a PFET.

10. A system comprising:
  a controller adapted to be coupled to a connector, the controller configured to provide power to the connector, the controller comprising:
    an amplifier configured to send a fixed frequency signal to the connector, the amplifier comprising:
      a buffer circuit comprising:
        a first transistor having a first current terminal, a second current terminal, and a control terminal, the first current terminal directly connected to an output terminal, and the control terminal directly connected to an input terminal;
        a second transistor having a first current terminal, a second current terminal, and a control terminal, the first current terminal coupled to the second current terminal of the first transistor, the control terminal coupled to a bias voltage terminal, and the first and second transistors are opposite transistor types;
        a third transistor having a first current terminal, a second current terminal, and a control terminal, the first current terminal coupled to the output terminal, the second current terminal coupled to a ground terminal, and the control terminal coupled to the second current terminal of the second transistor; and
        a fourth transistor having a first current terminal, a second current terminal, and a control terminal, the first current terminal coupled to the second current terminal of the second transistor, the second current terminal coupled to the ground terminal, and the control terminal coupled to the second current terminal of the third transistor.

11. The system of claim 10, wherein the connector is a universal serial bus (USB) connector and the controller is a USB power delivery (PD) controller.

12. The system of claim 10, further comprising the connector coupled to the controller.

13. The system of claim 10, further comprising a current source coupled to the second current terminal of the first transistor and the first current terminal of the second transistor.

14. The system of claim 10, further comprising a bias voltage circuit coupled to the bias voltage terminal.

15. The system of claim 10, wherein the first transistor is an n-type transistor, the second transistor is a p-type transistor, the third transistor is an n-type transistor, and the fourth transistor is an n-type transistor.

16. The system of claim 15, wherein the first transistor is an n-channel field effect transistor (NFET), the second transistor is a p-channel filed effect transistor (PFET), the third transistor is an NFET, and the fourth transistor is an NFET.

17. A circuit, comprising:
  a preamplifier circuit having an input and an output;
  a buffer circuit comprising:
    a first transistor having a first current terminal, a second current terminal, and a control terminal, the first current terminal directly connected to the input of the preamplifier circuit and the control terminal directly connected to the output of the preamplifier circuit;
    a second transistor having a first current terminal, a second terminal, and a control terminal, the first current terminal coupled to the second current terminal of the first transistor, the control terminal coupled to a bias voltage terminal, and the first and second transistors are opposite transistor types;
    a third transistor having a first current terminal, a second current terminal, and a control terminal, the first current terminal coupled to the input of the preamplifier circuit, and the control terminal coupled to the second current terminal of the second transistor; and
    a fourth transistor having a first current terminal, a second current terminal, and a control terminal, the first current terminal coupled to the second current terminal of the second transistor, and the control terminal coupled to the second current terminal of the second transistor.

18. The circuit of claim 17, further comprising:
a current source coupled to the second current terminal of the first transistor and the first current terminal of the second transistor; and
a bias voltage circuit coupled to the bias voltage terminal.

19. The circuit of claim 17, wherein the first transistor is an n-type transistor, the second transistor is a p-type transistor, the third transistor is an n-type transistor, and the fourth transistor is an n-type transistor.

20. The circuit of claim 19, wherein the first transistor is an n-channel field effect transistor (NFET), the second transistor is a p-channel filed effect transistor (PFET), the third transistor is an NFET, and the fourth transistor is an NFET.

* * * * *